United States Patent
Song et al.

(10) Patent No.: US 11,545,510 B2
(45) Date of Patent: Jan. 3, 2023

(54) ARRAY SUBSTRATE, AND PRODUCTION METHOD THEREOF, DISPLAY PANEL, AND DISPLAY APPARATUS

(71) Applicants: HEFEI XINSHENG OPTOELECTRONICS TECHNOLOGY CO., LTD., Anhui (CN); BOE Technology Group Co., Ltd., Beijing (CN)

(72) Inventors: Wei Song, Beijing (CN); Ce Zhao, Beijing (CN); Yuankui Ding, Beijing (CN); Ming Wang, Beijing (CN); Yingbin Hu, Beijing (CN); Qinghe Wang, Beijing (CN); Wei Li, Beijing (CN); Liusong Ni, Beijing (CN)

(73) Assignees: Hefei Xinsheng Optoelectronics Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 22 days.

(21) Appl. No.: 17/054,823

(22) PCT Filed: Apr. 16, 2020

(86) PCT No.: PCT/CN2020/085107
§ 371 (c)(1),
(2) Date: Nov. 12, 2020

(87) PCT Pub. No.: WO2020/244313
PCT Pub. Date: Dec. 10, 2020

(65) Prior Publication Data
US 2021/0265392 A1   Aug. 26, 2021

(30) Foreign Application Priority Data
Jun. 6, 2019   (CN) .......................... 201910489759.3

(51) Int. Cl.
*H01L 21/00* (2006.01)
*H01L 27/00* (2006.01)
(Continued)

(52) U.S. Cl.
CPC ...... *H01L 27/127* (2013.01); *H01L 21/02565* (2013.01); *H01L 27/1225* (2013.01);
(Continued)

(58) Field of Classification Search
CPC ......... H01L 21/02565; H01L 21/02592; H01L 21/77; H01L 27/1225; H01L 27/127;
(Continued)

(56) References Cited

U.S. PATENT DOCUMENTS 8,436,342 B2   5/2013   Park et al.
9,412,876 B2   8/2016   Koezuka et al.
(Continued)

FOREIGN PATENT DOCUMENTS

CN   101789434 A   7/2010
CN   101794809 A   8/2010
(Continued)

OTHER PUBLICATIONS

First Office Action, including Search Report, for Chinese Patent Application No. 201910489759.3, dated Dec. 3, 2020, 13 pages.

*Primary Examiner* — Nikolay K Yushin
(74) *Attorney, Agent, or Firm* — Westman, Champlin & Koehler, P.A.

(57) ABSTRACT

This disclosure discloses an array substrate, and a production method, a display panel, and a display apparatus thereof. Particularly, this disclosure proposes a method of producing an array substrate, having the following steps: providing a substrate having a drive transistor region and a switch transistor region thereon; forming an preset layer for active layer on a side of the substrate; patterning the preset (Continued)

layer for active layer to form a drive active layer and a switch active layer, wherein an orthographic projection of the drive active layer on the substrate is located in the drive transistor region, an orthographic projection of the switch active layer on the substrate is located in the switch transistor region, and a carrier concentration in the drive active layer is less than a carrier concentration in the switch active layer.

12 Claims, 4 Drawing Sheets

(51) Int. Cl.
| | |
|---|---|
| *H01L 29/00* | (2006.01) |
| *H01L 27/12* | (2006.01) |
| *H01L 21/02* | (2006.01) |
| *H01L 29/24* | (2006.01) |
| *H01L 29/66* | (2006.01) |
| *H01L 29/786* | (2006.01) |

(52) U.S. Cl.
CPC .......... *H01L 27/1288* (2013.01); *H01L 29/24* (2013.01); *H01L 29/66969* (2013.01); *H01L 29/7869* (2013.01); *H01L 29/78633* (2013.01); *H01L 29/78696* (2013.01)

(58) Field of Classification Search
CPC ............. H01L 27/1233; H01L 27/1288; H01L 29/7869; H01L 29/78696; H01L 29/78633; H01L 29/66969; H01L 29/24
See application file for complete search history.

(56) References Cited

U.S. PATENT DOCUMENTS

| | | | |
|---|---|---|---|
| 9,768,203 B2 | 9/2017 | Han et al. | |
| 9,997,637 B2 | 6/2018 | Koezuka et al. | |
| 10,153,304 B2 | 12/2018 | Qin | |
| 10,249,768 B2* | 4/2019 | Koezuka | H01L 27/1225 |
| 10,367,012 B2* | 7/2019 | Lim | H01L 29/7869 |
| 10,446,589 B2 | 10/2019 | Lou et al. | |
| 2010/0176383 A1 | 7/2010 | Park et al. | |
| 2015/0228803 A1 | 8/2015 | Koezuka et al. | |
| 2016/0315104 A1 | 10/2016 | Han et al. | |
| 2017/0033238 A1 | 2/2017 | Koezuka et al. | |
| 2018/0076238 A1* | 3/2018 | Lim | H01L 27/1237 |
| 2018/0175073 A1 | 6/2018 | Wang | |
| 2018/0182783 A1 | 6/2018 | Qin | |
| 2018/0219102 A1* | 8/2018 | Koezuka | H01L 29/7869 |
| 2019/0165004 A1 | 5/2019 | Lou et al. | |

FOREIGN PATENT DOCUMENTS

| | | |
|---|---|---|
| CN | 104900653 A | 9/2015 |
| CN | 106057826 A | 10/2016 |
| CN | 106158978 A | 11/2016 |
| CN | 106298959 A | 1/2017 |
| CN | 106449667 A | 2/2017 |
| CN | 107170759 A | 9/2017 |
| CN | 107230681 A | 10/2017 |
| CN | 107768385 A | 3/2018 |
| CN | 107978610 A | 5/2018 |
| CN | 109728003 A | 5/2019 |
| CN | 110164875 A | 8/2019 |
| JP | 2003084307 A | 3/2003 |
| TW | 201533912 A | 9/2015 |

* cited by examiner

ARRAY SUBSTRATE, AND PRODUCTION METHOD THEREOF, DISPLAY PANEL, AND DISPLAY APPARATUS

CROSS-REFERENCE TO RELATED APPLICATION

This application is a Section 371 National Stage Application of International Application No. PCT/CN2020/085107, filed on Apr. 16, 2020, entitled "ARRAY SUBSTRATE, AND PRODUCTION METHOD THEREOF, DISPLAY PANEL, AND DISPLAY APPARATUS", which claims priority to Chinese patent Application No. 201910489759.3 filed on Jun. 6, 2019, the disclosure of which are incorporated herein by reference in their entireties.

TECHNICAL FIELD

This disclosure relates to the field of display, and particularly to an array substrate, and a production method thereof, a display panel, and a display apparatus.

BACKGROUND ART

Thin-film transistors (TFTs) are main drive elements in current liquid crystal display panels and active-matrix driven organic light-emitting display panels, and properties of thin-film transistors will directly influence display properties of display panels. At present, in a display panel having thin-film transistors, a part of thin-film transistors are used as drive transistors (DR TFTs) and a part of thin-film transistors are used as switch transistors (SW TFTs) in an array substrate. The threshold voltages of drive transistors and switch transistors are of important influence for the display quality of display panels.

However, current thin-film transistors, and production methods thereof, display panels, display apparatuses, and the like are still to be improved.

SUMMARY

In an aspect of this disclosure, this disclosure proposes a method of producing an array substrate. According to an embodiment of this disclosure, this method comprises: providing a substrate having a drive transistor region and a switch transistor region thereon; forming an preset layer for active layer on a side of the substrate; patterning the preset layer for active layer to form a drive active layer and a switch active layer, wherein an orthographic projection of the drive active layer on the substrate is located in the drive transistor region, an orthographic projection of the switch active layer on the substrate is located in the switch transistor region, and a carrier concentration in the drive active layer is less than a carrier concentration in the switch active layer.

According to an embodiment of this disclosure, the preset layer for active layer formed comprises two sublayers of which carrier concentrations are different, and a surface of the drive active layer away from the substrate and a surface of the switch active layer away from the substrate belong to the two sublayers, respectively.

According to an embodiment of this disclosure, among the two sublayers, a carrier concentration in the sublayer closer to the substrate is less than a carrier concentration in the sublayer further away from the substrate.

According to an embodiment of this disclosure, in the formed preset layer for active layer, the two sublayers are adjacent to each other and are different in material.

According to an embodiment of this disclosure, the two sublayers are a first sublayer and a second sublayer, and the first sublayer is closer to the substrate than the second sublayer, materials for forming the first sublayer comprise indium gallium zinc oxide, the first sublayer has a thickness of 10-50 nm, and a carrier concentration in the first sublayer is $10^{15}$-$10^{19}$ $cm^2V^{-1}s^{-1}$; materials for forming the second sublayer comprise indium zinc oxide, the second sublayer has a thickness of 10-50 nm, and a carrier concentration in the second sublayer is $10^{18}$-$10^{20}$ $cm^2V^{-1}s^{-1}$.

According to an embodiment of this disclosure, said patterning the preset layer for active layer comprises the steps of: etching the preset layer for active layer into a first part and a second part by a patterning process using a photoresist, wherein an orthographic projection of the first part on the substrate located in in the drive transistor region, and a first photoresist layer is retained on a surface of a side of the first part away from the substrate; an orthographic projection of the second part on the substrate is located in the switch transistor region, and a second photoresist layer is retained on a surface of a side of the second part away from the substrate; and a thickness of the second photoresist layer is greater than a thickness of the first photoresist layer; removing the first photoresist layer by etching to expose the first part, and retaining a remaining thickness of the second photoresist layer on a surface of a side of the second part away from the substrate; setting a carrier concentration in the first part to be less than a carrier concentration in the second part by carrier concentration differentiation treatment; and removing the remaining thickness of the second photoresist layer, so that the first part forms the drive active layer and the second part forms the switch active layer.

According to an embodiment of this disclosure, the carrier concentration differentiation treatment comprises: setting a thickness of the first part to be less than a thickness of the second part by etching.

According to an embodiment of this disclosure, the preset layer for active layer comprises two sublayers of which carrier concentrations are different, and the carrier concentration differentiation treatment further comprises: removing a sublayer away from the substrate among the two sublayers in the first part by wet etching.

According to an embodiment of this disclosure, the carrier concentration differentiation treatment comprises: performing annealing treatment on the first part or performing treatment on the first part by using plasma excited by an oxidative gas in an oxidative gas atmosphere to set a carrier concentration in the first part to be less than a carrier concentration in the second part.

According to an embodiment of this disclosure, the step of etching the preset layer for active layer into a first part and a second part comprises: coating a photoresist on a surface of a side of the preset layer for active layer away from the substrate; exposing and developing the photoresist by using a half-tone mask plate to form a photoresist layer, the photoresist layer comprising: the first photoresist layer with the photoresist partly retained and the second photoresist layer with the photoresist completely retained; performing etching treatment on the preset layer for active layer to remove the preset layer for active layer which is not covered by the photoresist layer to form the first part and the second part; and the step of removing the first photoresist layer to expose the first part comprises dry etching.

In another aspect of this disclosure, this disclosure proposes an array substrate. According to an embodiment of this disclosure, the array substrate is produced by the method described above.

In still another aspect of this disclosure, this disclosure proposes an array substrate. According to an embodiment of this disclosure, this array substrate comprises: a substrate; and a drive transistor and a switch transistor located on the substrate, wherein a carrier concentration in a drive active layer of the drive transistor is less than a carrier concentration in a switch active layer of the switch transistor.

According to an embodiment of this disclosure, a thickness of the drive active layer is less than a thickness of the switch active layer; or at least one of the drive active layer and the switch active layer comprises a plurality of sublayers provided by lamination, wherein a number of the sublayers in the drive active layer is less than a number of the sublayers in the switch active layer; or a concentration of carriers doped in the drive active layer is less than a concentration of the carriers doped in the switch active layer.

According to an embodiment of this disclosure, the switch active layer comprises a first sublayer and a second sublayer, wherein the first sublayer is closer to the substrate than the second sublayer, and a surface of the switch active layer away from the substrate belongs to the second sublayer, and the drive active layer comprises a third sublayer formed in the same layer with the first sublayer, and a surface of the drive active layer away from the substrate belongs to the third sublayer.

According to an embodiment of this disclosure, materials for forming the first sublayer/third sublayer comprise indium gallium zinc oxide, the first sublayer/third sublayer has a thickness of 10-50 nm, and a carrier concentration in the first sublayer/third sublayer is $10^{15}$-$10^{19}$ $cm^2V^{-1}s^{-1}$; materials for forming the second sublayer comprise indium zinc oxide, the second sublayer has a thickness of 10-50 nm, and a carrier concentration in the second sublayer is $10^{18}$-$10^{20}$ $cm^2V^{-1}s^{-1}$.

In still another aspect of this disclosure, this disclosure proposes a display panel. According to an embodiment of this disclosure, this display panel comprises the array substrate described above.

In still another aspect of this disclosure, this disclosure proposes a display apparatus. According to an embodiment of this disclosure, this display apparatus comprises: a housing; and the display panel described above.

DESCRIPTION OF DRAWINGS

The above and/or additional aspects and advantages of this disclosure will become apparent and easily understood from the following description of embodiments in conjunction with accompanying drawings, in which.

DESCRIPTION OF EMBODIMENTS

This disclosure is made based on the inventor's finding and recognition with respect to the following fact and problem.

With respect to current array substrates, there is usually a problem that the threshold voltages of the drive transistor and the switch transistor are inconsistent (the threshold voltage of the switch transistor is typically greater than the threshold voltage of the drive transistor) and in turn the display quality of the display panel is influenced. As found by the inventor, this is mainly for the following reason. In order to improve the stability of the drive transistor (particularly the top-gate drive transistor), a light-shielding layer is typically formed between the drive transistor and the substrate to prevent external light beams from being incident from the side of the substrate to the active layer of the drive transistor, thereby avoiding the deterioration of the characteristics of the drive transistor caused by irradiation of light. Since the requirements for the characteristics and the stability of the switch transistor are relatively low and in consideration of improving the aperture ratio, there is typically no light-shielding layer provided between the switch transistor and the substrate. Therefore, the above described problem that the threshold voltages of the drive transistor and the switch transistor are inconsistent is caused. Therefore, if there can be provided a novel array substrate and a production method thereof, which result in that the threshold voltages of the drive transistor and the switch transistor have a good consistency in a case where there is a light-shielding layer between the drive transistor and the substrate and there is no light-shielding layer between the switch transistor and the substrate, the display quality of the display panel will be well improved and the problem described above will be solved to a large extent.

Embodiments of this disclosure are described in detail below, and instances of the embodiments are shown in the accompanying drawings, wherein the same or similar numerals represent the same or similar elements or elements having the same or similar functions throughout. The embodiments described below with reference to the accompanying drawings are exemplary and are merely used for explaining this disclosure, and it cannot be construed to be limitations of this disclosure.

Reference numerals are described as follows:
100: substrate;
110: drive transistor region;
120: switch transistor region;
200: preset layer for active layer;
10: sublayer;
210: drive active layer;
220: switch active layer;
211: first part;
221: second part;
300: photoresist;

310: photoresist layer;
311: first photoresist layer;
312: second photoresist layer;
400: half-tone mask plate;
500: light-shielding layer;
510: metal thin film;
600: buffering layer;
1000: array substrate.

In an aspect of this disclosure, this disclosure proposes a method of producing an array substrate. As described above, there is a light-shielding layer (Shield layer) between the drive transistor and the substrate and there is no light-shielding layer between the switch transistor and the substrate in current array substrates. This will result in that the threshold voltages (Vth) of the drive transistor and the switch transistor are inconsistent (the threshold voltage of the switch transistor is typically greater than the threshold voltage of the drive transistor) and in turn the display quality of the display panel using this array substrate is influenced. In the present application, the inventor has found that the carrier concentration in the active layer greatly influences the threshold voltage. Therefore, in a method according to an embodiment of this disclosure, the carrier concentration in the drive active layer (i.e., the active layer in the drive transistor) is set to be less than the carrier concentration in the switch active layer (i.e., the active layer in the switch transistor) in a case where there is a light-shielding layer between the drive transistor and the substrate and there is no light-shielding layer between the switch transistor and the substrate. The threshold voltage in the drive transistor may be improved, thereby resulting in that the threshold voltages of the switch transistor and the drive transistor in the array substrate produced are relatively consistent, and in turn the display quality of the display panel using this array substrate is improved.

Figure 1:
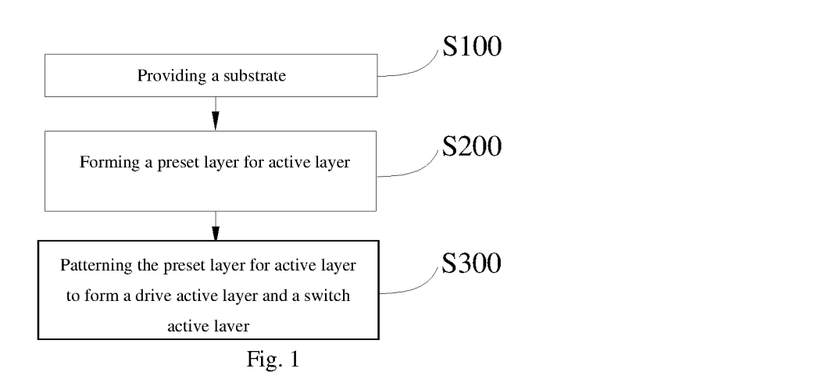
FIG. 1 shows a flow chart of a method of producing an array substrate according to an embodiment of this disclosure.

According to an embodiment of this disclosure, with reference to FIG. 1, this method comprises:

S100: Providing a substrate

In this step, a substrate is provided. According to an embodiment of this disclosure, with reference to (a) in FIG. 4, the substrate 100 may be glass or the like. Particularly, a drive transistor region 110 and a switch transistor region 120 are provided on a substrate 100. In the subsequent production process, the drive transistor is formed, for example, exactly above this drive transistor region 110, and the switch transistor is formed, for example, exactly above this switch transistor region 120.

S200: Forming a preset layer for active layer, which may comprises at least two sublayers provided by lamination In this step, a preset layer for active layer is formed on a side of the substrate described above and comprises at least two sublayers provided by lamination. According to an embodiment of this disclosure, with reference to (b) in FIG. 4, the preset layer 200 for active layer comprises at least two sublayers 10 provided by lamination (for example, referring to the first sublayer 10A and the second sublayer 10B as shown in the figure). According to an embodiment of this disclosure, the preset layer 200 for active layer may be formed on a side of the substrate 100 by a deposition method. Particularly, oxide semiconductor thin films may be deposited on a side of the substrate 100, respectively, so that a plurality of sublayers 10 are formed, respectively. According to an embodiment of this disclosure, Materials for forming the preset layer 200 for active layer are not particularly limited, and may comprise, for example, at least one of indium zinc oxide (IZO), indium gallium zinc oxide (IGZO), and indium gallium tin oxide (IGTO).

According to a method in an embodiment of this disclosure, the preset layer for active layer formed comprises at least two sublayers provided by lamination. In this method, the material, the thickness, the carrier concentration, and the like of each sublayer in the preset layer for active layer may be set, and the number of the sublayers, the manner in which the plurality of sublayers are combined, and the like may be set. On the one hand, the drive active layer and the switch active layer finally formed may thus have good utilization performances. Particularly, the conducting channel of the thin-film transistor is mainly a front channel (i.e., the active layer on a side close to the gate electrode), Therefore, in a method according to an embodiment of this disclosure, in an array substrate having two active layers (a drive active layer and a switch active layer), the carrier concentration of the front channel may be set to be relatively high so as to be favorable to the improvement of the mobility of this thin-film transistor while the carrier concentration of the active layer on a side away from the gate electrode (rear channel) may be set to be relatively low so as to be able to reduce the energy consumption of this thin-film transistor and save energy, when a preset layer for active layers is formed by using a plurality of sublayers. On the other hand, it is favorable to the adjustment of the difference between the carrier concentrations in the drive active layer and the switch active layer finally formed in subsequent steps, the production process may be simplified, the consistency between the threshold voltages of the switch transistor and the drive transistor in the array substrate produced is further improved, and the display quality of the display panel using this array substrate is improved.

Figure 4:
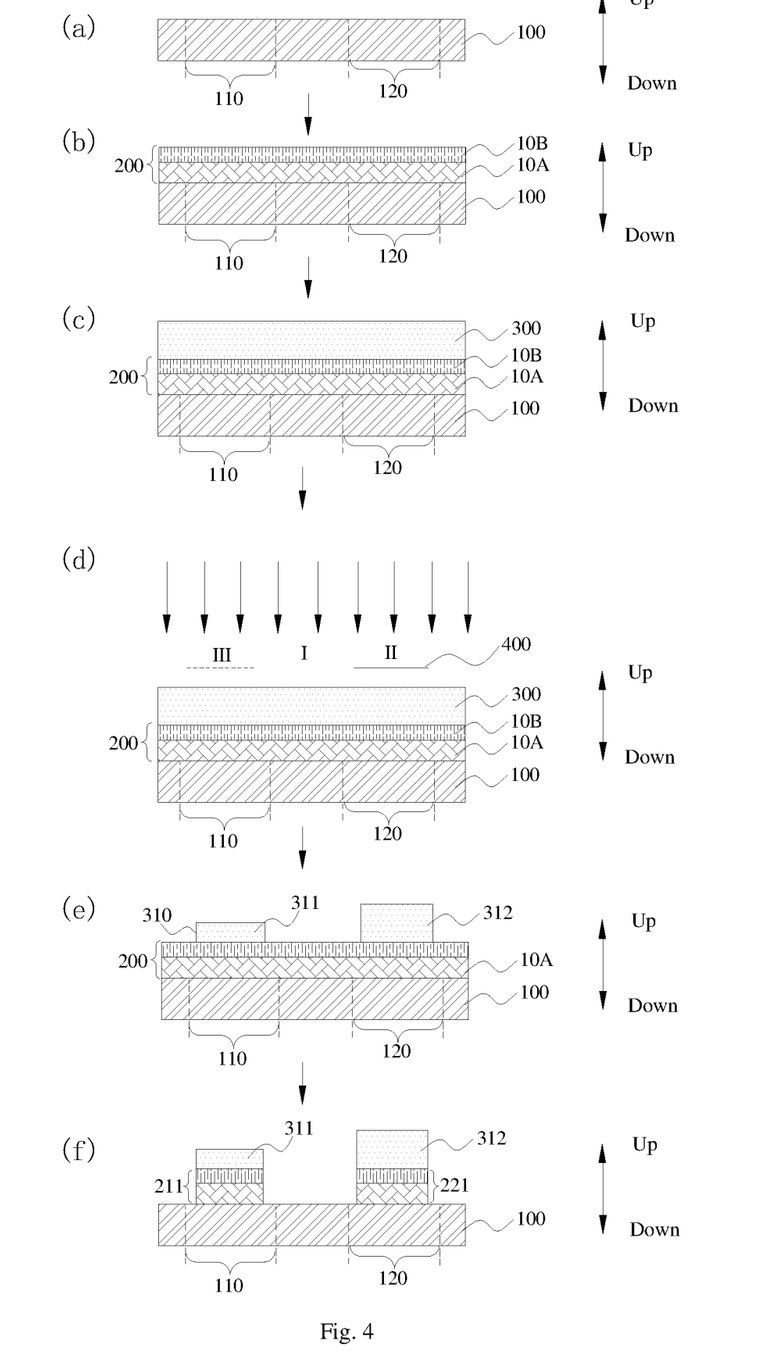
FIG. 4 shows a flow chart of a method of producing an array substrate according to still another embodiment of this disclosure.

According to an embodiment of this disclosure, with reference to (b) in FIG. 4, the carrier concentrations in different sublayers 10 may be different in the preset layer 200 for active layer formed (for example, the carrier concentrations in the first sublayer 10A and the second sublayer 10B may be different). Therefore, the utilization performances of the drive active layer and the switch active layer may be further improved; and it is favorable to the adjustment of the difference between the carrier concentrations of the drive active layer and the switch active layer finally formed, the consistency between the threshold voltages of the switch transistor and the drive transistor in the array substrate produced is further improved, and the display quality of the display panel using this array substrate is improved. Particularly, the carrier concentration in the first sublayer 10A close to the substrate 100 may be less than the carrier concentration in the second sublayer 10B away from the substrate 100. Therefore, the utilization performance of the array substrate produced is further improved. Particularly, the carrier concentration in the first sublayer 10A may be $10^{15}$-$10^{19}$ $cm^2V^{-1}s^{-1}$, and may be, for example, $10^{16}$ $cm^2V^{-1}s^{-1}$, $10^{17}$ $cm^2V^{-1}s^{-1}$, $10^{18}$ $cm^2V^{-1}s^{-1}$, or the like; the carrier concentration in the second sublayer 10B may be $10^{18}$-$10^{20}$ $cm^2V^{-1}s^{-1}$, and may be, for example, $10^{19}$ $cm^2V^{-1}s^{-1}$, or the like. Therefore, in a method according to an embodiment of this disclosure, the carrier concentrations in different sublayers are different. As described above, the carrier concentration of the front channel may be set to be relatively high so that it is favorable to the improvement of the mobility of this thin-film transistor while the carrier concentration of the rear channel may be set to be relatively low so as to be able to reduce the energy consumption of this thin-film transistor and save energy. Particularly, in a top gate type thin-film transistor, the side close to the substrate 100 is the side away from the gate electrode (not shown in the figure), and the side away from the substrate 100 is the side close to the gate electrode (not shown in the figure). The carrier concentration in the first sublayer 10A is less than the carrier concentration in the second sublayer 10B. Not only the mobility of this thin-film transistor may be improved, but the energy consumption may also be saved, and the utilization performance of the array substrate produced is further improved. Furthermore, it is possible to only remove the second sublayer 10B whose orthographic projection is located in the drive transistor region 110 in subsequent steps, so as to reduce the carrier concentration in the active layer of the drive transistor finally formed, and the threshold voltage of the active layer of the drive transistor finally formed is increased. The difference between the carrier concentrations in the switch active layer and the drive active layer finally formed may be set to be in a certain range (this difference is the carrier concentration in the second sublayer 10B), the reduction of the threshold voltage of the drive transistor caused by the light-shielding layer provided below may be well compensated, the consistency between the threshold voltages of the switch transistor and the drive transistor in the array substrate produced may be improved, and the display quality of the display panel using this array substrate may be improved.

According to an embodiment of this disclosure, with reference to (b) in FIG. 4, materials for forming different sublayers 10 may be different in the formed preset layer 200 for active layer (for example, the materials of the first sublayer 10A and the second sublayer 10B may be different). Particularly, the material of the first sublayer may be indium gallium zinc oxide, and the material of the second sublayer may be indium zinc oxide. Therefore, the preset layer for active layer is formed by combining various materials. Not only is the utilization performance of the array substrate produced improved, but wet etching treatment may also be performed in a subsequent step by selecting a suitable etching agent (for example, selecting an etching agent which can only dissolve and etch the second sublayer 10B, but not the first sublayer 10A), so as to remove the second sublayer 10B whose orthographic projection is located in the drive transistor region 110 simply and conveniently. The carrier concentration in the active layer of the drive transistor finally formed is reduced, while the first sublayer 10A will not be impaired. That is, the utilization performance of the active layer of the drive transistor finally formed will not be impaired.

According to an embodiment of this disclosure, with reference to (b) in FIG. 4, the thicknesses of different sublayers 10 may be different in the preset layer 200 for active layer formed (for example, the thicknesses of the first sublayer 10A and the second sublayer 10B may be different). Particularly, the thickness of the first sublayer 10A may be 10-50 nm, and may be particularly 15 nm, 20 nm, 25 nm, 28 nm, 30 nm, 35 nm, 40 nm, 45 nm, or the like; and the thickness of the second sublayer 10B may be 10-50 nm, and may be particularly 15 nm, 20 nm, 25 nm, 28 nm, 30 nm, 35 nm, 40 nm, 45 nm, or the like. Therefore, the utilization performances of the drive active layer and the switch active layer may be further improved; and it is favorable to the adjustment of the difference between the carrier concentrations of the drive active layer and the switch active layer finally formed, to further improve the consistency between the threshold voltages of the switch transistor and the drive transistor in the array substrate produced, and to improve the display quality of the display panel using this array substrate.

According to a specific embodiment of this disclosure, with reference to (b) in FIG. 4, the preset layer 200 for active layer may comprise a first sublayer 10A and a second sublayer 10B provided by lamination, and the first sublayer 10A is provided closer to the substrate 100. Materials for forming the first sublayer 10A comprise indium gallium zinc oxide, the first sublayer 10A has a thickness of 10-50 nm, and the carrier concentration in the first sublayer 10A is $10^{15}$-$10^{19}$ cm$^2$V$^{-1}$s$^{-1}$; and materials for forming the second sublayer 10B comprise indium zinc oxide, the second sublayer 10B has a thickness of 10-50 nm, and the carrier concentration in the second sublayer 10B is $10^{18}$-$10^{20}$ cm$^2$V$^{-1}$s$^{-1}$. Therefore, the utilization performances of the drive active layer and the switch active layer may be further improved; and it is favorable to the adjustment of the difference between the carrier concentrations of the drive active layer and the switch active layer finally formed, to further improve the consistency between the threshold voltages of the switch transistor and the drive transistor in the array substrate produced, and to improve the display quality of the display panel using this array substrate.

Figure 2:
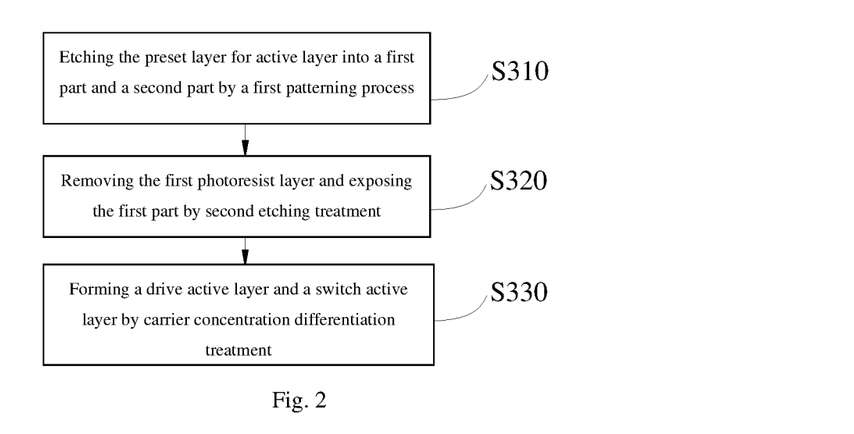
FIG. 2 shows a flow chart of a method of producing an array substrate according to another embodiment of this disclosure.
Figure 3:
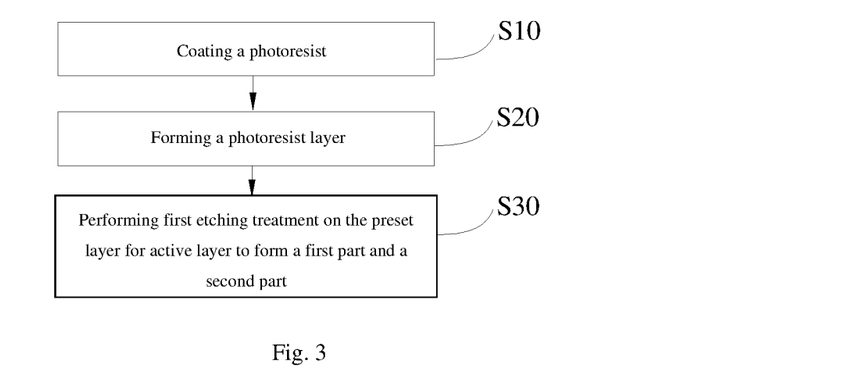
FIG. 3 shows a flow chart of a method of producing an array substrate according to still another embodiment of this disclosure.

S300: Patterning the preset layer for active layer to form a drive active layer and a switch active layer, In this step, the preset layer for active layer produced in the previous step is patterned to form a drive active layer and a switch active layer, wherein the orthographic projection of the drive active layer on the substrate is located in the drive transistor region, the orthographic projection of the switch active layer on the substrate is located in the switch transistor region, and the carrier concentration in the drive active layer is less than the carrier concentration in the switch active layer. According to an embodiment of this disclosure, with reference to FIG. 2, this method further comprises:

S310: Etching the preset layer for active layer into a first part and a second part by a first patterning process In this step, the preset layer for active layer produced in the previous step is etched into a first part and a second part by a first patterning process. According to an embodiment of this disclosure, with reference to FIG. 3, etching the preset layer for active layer into a first part and a second part may be achieved by the following steps.

S10: Coating a photoresist

In this step, a photoresist is coated on a surface of a side of the preset layer for active layer produced in the previous step away from the substrate. According to an embodiment of this disclosure, with reference to (c) in FIG. 4, a photoresist 300 is coated on the surface of the side of the preset layer 200 for active layer away from the substrate 100.

S20: Forming a photoresist layer

In this step, the photoresist coated in the previous step is exposed and developed by using a half-tone mask plate to form a photoresist layer. According to an embodiment of this disclosure, with reference to (d) in FIG. 4, the half-tone mask plate 400 may comprise a partly light-transmitting region III, a completely opaque region II, and a completely light-transmitting region I (in FIG. 4 (d), the solid line represents completely opaque, the dashed line represents partly light-transmitting, and the unlined region represents completely light-transmitting). Therefore, after the photoresist 300 is exposed and developed by using this half-tone mask plate 400, with reference to (e) in FIG. 4, the formed photoresist layer 310 comprises: a region with the photoresist partly retained corresponding to the partly light-transmitting region III, i.e., the first photoresist layer 311; and a region with the photoresist completely retained corresponding to the completely opaque region II, i.e., the second photoresist layer 312. The photoresist in the region corresponding to the completely light-transmitting region I is not developed. That is, no photoresist layer is formed. Furthermore, the thickness of the first photoresist layer 311 formed is less than the thickness of the second photoresist layer 312.

S30: Performing first etching treatment on the preset layer for active layer to form a first part and a second part In this step, first etching treatment is performed on the preset layer for active layer provided with the photoresist layer in the previous step to remove the preset layer for active layer which is not covered by the photoresist layer to form the first part and the second part. According to an embodiment of this disclosure, with reference to (f) in FIG. 4, after first etching treatment is performed on the preset layer 200 for active layer, the preset layer 200 for active layer which is not covered by the photoresist layer 310 is removed (the preset layer 200 for active layer in the region covered by the photoresist layer 310 will not be etched) to form the first part 211 and the second part 221. Here, the orthographic projection of the first part 211 on the substrate 100 is located in the drive transistor region 110, and the surface of the side of the first part 211 away from the substrate 100 has a first photoresist layer 311; the orthographic projection of the second part 221 on the substrate 100 is located in the switch transistor region 120, and the surface of the side of the second part 221 away from the substrate 100 has a second photoresist layer 312. Therefore, the preset layer 200 for active layer formed in the previous step may be simply and conveniently etched into the first part 211 and the second part 221. Particularly, the first etching treatment may be wet etching treatment.

Figure 5:
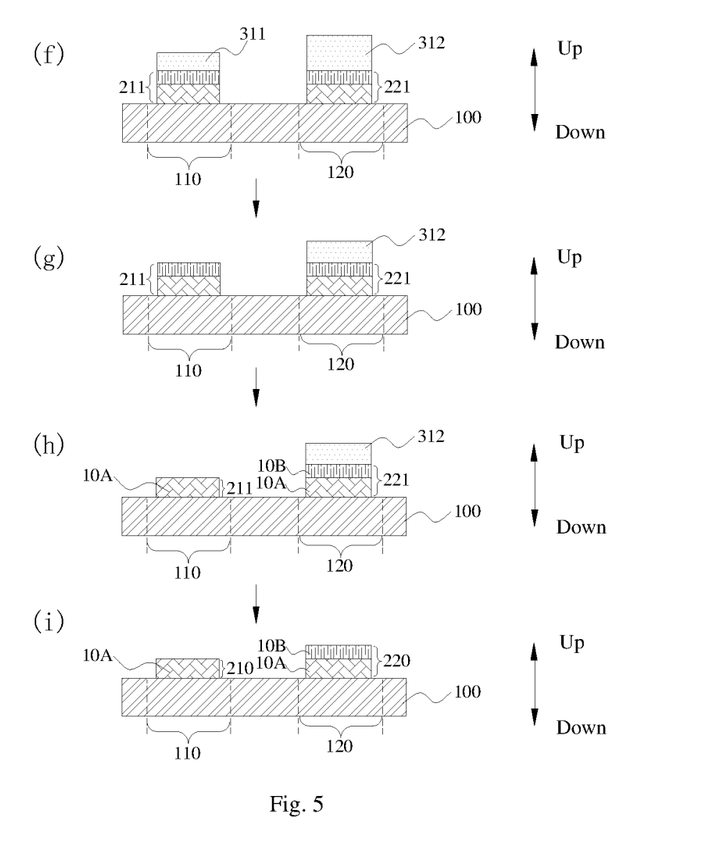
FIG. 5 shows a flow chart of a method of producing an array substrate according to still another embodiment of this disclosure.

S320: Removing the first photoresist layer and exposing the first part by second etching treatment In this step, second etching treatment is performed on the first part whose surface is covered by the first photoresist layer and the second part whose surface is covered by the second photoresist layer formed in the previous step (as shown in FIG. 5 (*f*), i.e., FIG. 4 (*f*)) to remove the first photoresist layer on the surface of the first part and expose the first part. According to an embodiment of this disclosure, since the thickness of the first photoresist layer formed above is less than the thickness of the second photoresist layer, the second photoresist layer will be still partly retained while the first photoresist layer is completely etched to expose the first part rear the second etching treatment. According to an embodiment of this disclosure, with reference to (g) in FIG. 5 for the structure of the preset layer for active layer after the second etching treatment, the first part 211 is exposed and the top of the second part 221 is still partly covered by the second photoresist layer 312. Particularly, the second etching treatment may be dry etching treatment.

S330: Forming a drive active layer and a switch active layer by carrier concentration differentiation treatment In this step, carrier concentration differentiation treatment is performed on the preset layer for active layer subjected to the second etching treatment in the previous step, so that the carrier concentration in the first part is less than the carrier concentration in the second part, so as to form a drive active layer a and a switch active layer. Therefore, the drive active layer and the switch active layer may be simply and conveniently formed by this method. According to an embodiment of this disclosure, after the second etching treatment in the previous step, the first part is exposed and the second part is still partly covered by the second photoresist layer. Therefore, the carrier concentration differentiation treatment may be only performed on the exposed first part, and the second part will not be influenced. The carrier concentration in the first part may be reduced by the carrier concentration differentiation treatment, so that the carrier concentration in the first part after treatment is less than the carrier concentration in the second part. That is, the carrier concentration in the drive active layer finally produced is less than the carrier concentration in the switch active layer. The threshold voltage in the drive transistor is improved, thereby resulting in a good consistency between the threshold voltages of the switch transistor and the drive transistor in the array substrate finally produced, and the display quality of the display panel using this array substrate is improved.

According to some embodiments of this disclosure, the carrier concentration differentiation treatment may further comprise: setting the thickness of the first part to be less than the thickness of the second part by third etching treatment. That is, third etching treatment may be performed on the first part to reduce the thickness of the first part, so that the thickness of the first part is less than the thickness of the second part, and the carrier concentration in the first part is in turn less than the carrier concentration in the second part. Therefore, this method may simply and conveniently set the carrier concentration in the first part to be less than the carrier concentration in the second part, thereby improving the consistency between the threshold voltages of the switch transistor and the drive transistor in the array substrate finally produced, and the display quality of the display panel using this array substrate is improved. Particularly, the third etching treatment may be wet etching treatment. Particularly, the conditions (for example, etching time and the like) of the third etching treatment may be adjusted, so that the thickness difference between the first part and the second part finally formed is in a certain range. This thickness difference leads to the difference between the carrier concentrations in the first part and the second part. That is, the reduction of the thickness of the first part results in the increment of the threshold voltage of the drive transistor. The reduction of the threshold voltage of the drive transistor caused by the light-shielding layer provided below may be well compensated by the increment, thereby resulting in a good consistency between the threshold voltages of the switch transistor and the drive transistor in the array substrate finally produced, and the display quality of the display panel using this array substrate is improved. Therefore, this method may set the carrier concentration in the first part to be less than the carrier concentration in the second part, and the operation is simple and convenient, thereby improving the consistency between the threshold voltages of the switch transistor and the drive transistor in the array substrate finally produced, and the display quality of the display panel using this array substrate is improved.

According to further embodiments of this disclosure, as described above, the preset layer for active layer produced in a method according to an embodiment of this disclosure comprises a plurality of sublayers provided by lamination and the materials, the thicknesses, the carrier concentrations, and the like of the plurality of sublayers may be different. For example, the materials of two adjacent sublayers are different. In this case, the carrier concentration differentiation treatment may further comprise: etching and removing at least one sublayer of the first part by wet etching treatment. Particularly, since the materials of two adjacent sublayers are different, this carrier concentration differentiation treatment may be wet etching treatment. That is, the etching agent may merely etch a sublayer provided away from the substrate, but not impair other sublayers therebelow. Therefore, this method may simply and conveniently set the thickness of the first part finally formed to be less than the thickness of the second part. Particularly, with reference to (h) in FIG. 5 for the schematic diagram of the partial structure of the array substrate after the wet etching treatment, the second sublayer 10B in the first part 211 is removed by etching and only the first sublayer 10A is retained, while the second part 221 still comprises the first sublayer 10A and the second sublayer 10B. Particularly, as described above, the thickness of the sublayer removed by wet etching (i.e., the second sublayer 10B) may be preliminarily designed when the preset layer for active layer is produced in the previous step, so that reduction of the carrier concentration (i.e., the increase of the threshold voltage) of the first part 221 after this sublayer (i.e., the second sublayer 10B) is removed may exactly compensate the threshold voltage of the drive transistor caused by the light-shielding layer provided below, thereby resulting in a good consistency between the threshold voltages of the switch transistor and the drive transistor in the array substrate finally produced, and the display quality of the display panel using this array substrate is improved. That is, this method has simple and convenient operation and may well control the thickness difference between the first part and the second part, so as to better improve the consistency between the threshold voltages of the switch transistor and the drive transistor.

According to still further embodiments of this disclosure, the carrier concentration differentiation treatment may further comprise: performing annealing treatment on the exposed first part or performing treatment on the first part by using plasma excited by an oxidative gas in an oxidative gas atmosphere to set a carrier concentration in the first part to be less than a carrier concentration in the second part. Particularly, this method may be used in combination with the method of reducing the thickness of the first part described above or may be used alone. That is, this method may not necessarily perform etching treatment on the first part. That is, the thickness of the first part is not necessarily adjusted, and only the concentration of carriers doped in the first part is adjusted. Therefore, this method may simply and conveniently reduce the concentration of carriers doped in the first part so as to set the carrier concentration in the first part to be less than the carrier concentration in the second part, thereby improving the consistency between the threshold voltages of the switch transistor and the drive transistor in the array substrate finally produced, and the display quality of the display panel using this array substrate is improved.

According to an embodiment of this disclosure, after the carrier concentration differentiation treatment, this method may further comprise: removing the remaining photoresist layer. Therefore, the first part and the second part may be exposed, with reference to (i) in FIG. 5. A drive active layer 210 and a switch active layer 220 are formed so as to perform subsequent production, for example, forming structures of the thin-film transistor, such as source and drain electrodes, gate electrodes, and the like. Therefore, the drive active layer and the switch active layer may be simply and conveniently produced, thereby resulting in a good consistency between the threshold voltages of the switch transistor and the drive transistor in the array substrate finally produced, and the display quality of the display panel using this array substrate is improved.

Figure 6:
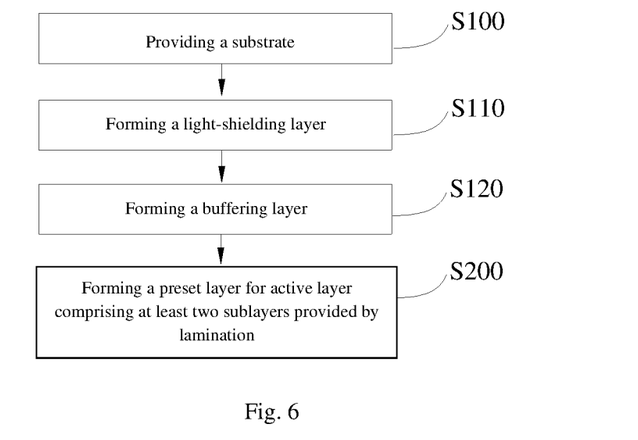
FIG. 6 shows a flow chart of a method of producing an array substrate according to still another embodiment of this disclosure.
Figure 7:
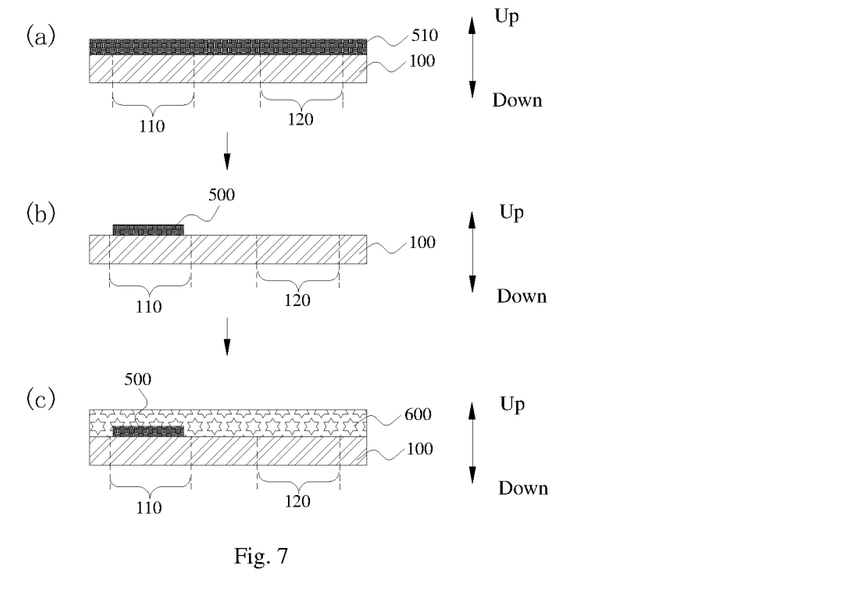
FIG. 7 shows a flow chart of a method of producing an array substrate according to still another embodiment of this disclosure.

According to an embodiment of this disclosure, with reference to FIG. 6 and FIG. 7, this method may further comprise, after the substrate is provided as described above and before the preset layer for active layer is formed:

S110: Forming a light-shielding layer

In this step, a front light-shielding layer is formed on the side of the drive transistor region of the substrate. This light-shielding layer may block the active layer of the drive transistor formed in subsequent steps from being irradiated by external light beams, thereby avoiding the deterioration of the characteristics of the drive transistor caused by irradiation of light. Particularly, with reference to FIG. 7, the light-shielding layer 500 may be formed by the method described below. An entire layer of metal thin film 510 is first deposited on a side of the substrate 100 (referring to (a) in FIG. 7), and then this metal thin film 510 is patterned (for example in a manner of providing a mask or the like) to form a light-shielding layer 500 (referring to (b) in FIG. 7). The orthographic projection of the formed light-shielding layer 500 on the substrate 100 is located in the drive transistor region 110.

S120: Forming a buffering layer

In this step, a buffering layer is formed on a side of the light-shielding layer formed in the previous step away from the substrate. Particularly, a layer of insulating thin film may be deposited on the side of the light-shielding layer away from the substrate, for example a material such as silicon oxide, silicon nitride, and the like may be deposited, so as to form a buffering layer. Particularly, the buffering layer may be formed by a plasma enhanced chemical vapor deposition (PECVD) method. Particularly, with reference to (c) in FIG. 7, the buffering layer 600 is formed on the side of the light-shielding layer 500 away from the substrate 100.

In another aspect of this disclosure, this disclosure proposes an array substrate. According to an embodiment of this disclosure, this array substrate is produced by the method described above. Therefore, this array substrate has all features and advantages which the array substrate produced by the method described above has, and verbose words are omitted herein. Generally speaking, this array substrate has a good uniformity of the threshold voltage, and the display quality of the display panel using this array substrate may be improved.

Figure 8:
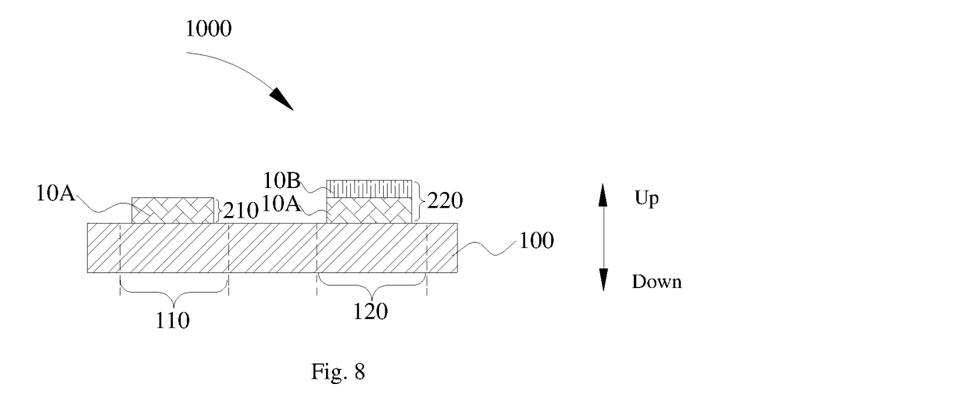
FIG. 8 shows a structural schematic diagram of an array substrate according to an embodiment of this disclosure.

In still another aspect of this disclosure, this disclosure proposes an array substrate. According to an embodiment of this disclosure, this array substrate may be produced by the method described above. In this case, this array substrate also has all features and advantages which the array substrate produced by the method described above has, and verbose words are omitted herein. According to an embodiment of this disclosure, with reference to FIG. 8, this array substrate 1000 comprises: a substrate 100 and a drive transistor and a switch transistor (not shown in the figure) located on a side of the substrate 100, wherein a drive transistor region 110 and a switch transistor region 120 are provided on a substrate 100, the drive transistor is located exactly above the drive transistor region 110, the switch transistor is located exactly above the switch transistor region 120, the preset layer for active layer of the drive transistor is the drive active layer 210 shown in the figure, and the preset layer for active layer of the switch transistor is the switch active layer 220 shown in the figure. Here, the carrier concentration in the drive active layer 210 is less than the carrier concentration in the switch active layer 220, and at least one of the drive active layer 210 and the switch active layer 220 comprises a plurality of sublayers 10 provided by lamination. Therefore, this array substrate has a good utilization performance, this array substrate has a good uniformity of the threshold voltage, and the display quality of the display panel using this array substrate may be improved. Particularly, the drive active layer 210 and the switch active layer 220 may each comprise at least two sublayers 10, or, the drive active layer 210 comprises a sublayer 10A and the switch active layer 220 comprises two sublayers 10A and 10B provided by lamination, with reference to those as shown in FIG. 8.

According to some embodiments of this disclosure, the thickness of the drive active layer 210 is less than the thickness of the switch active layer 220.

According to further embodiments of this disclosure, the number of the sublayers 10 in the drive active layer 210 is less than the number of the sublayers in the switch active layer 220. For example, the drive active layer 210 may comprise a sublayer 10A and the switch active layer 220 may comprise two sublayers 10A and 10B provided by lamination, with reference to those as shown in FIG. 8. Therefore, the carrier concentration in the drive active layer may be simply and conveniently set to be less than the carrier concentration in the switch active layer.

According to still further embodiments of this disclosure, the concentration of carriers doped in the drive active layer is less than a concentration of the carriers doped in the switch active layer. Therefore, the carrier concentration in the drive active layer may be simply and conveniently set to be less than the carrier concentration in the switch active layer. In this case, the thickness of the drive active layer 210 and the thickness of the switch active layer 220 may be the same or may be different. That is, even if the thickness of the drive active layer 210 is the same as the thickness of the switch active layer 220, the concentration of carriers doped in the drive active layer may be set to be less than the concentration of carriers doped in the switch active layer.

In still another aspect of this disclosure, this disclosure proposes a display panel. According to an embodiment of this disclosure, this display panel comprises the array substrate described above. Therefore, this display panel has all features and advantages which the array substrate described above has, and verbose words are omitted herein. Generally speaking, this display panel has a good display quality.

In still another aspect of this disclosure, this disclosure proposes a display apparatus. According to an embodiment of this disclosure, this display apparatus comprises: a housing; and the display panel described above. Therefore, this display apparatus has all features and advantages which the display panel described above has, and verbose words are omitted herein. Generally speaking, this display apparatus has a good display quality.

In the description of this specification, orientations and positional relationships indicated by terms "above", "below", etc., are based on orientations or positional relationships as shown in figures. They are merely intended to facilitate the description of this disclosure, but do not require that this disclosure are necessarily configured and operated in specific orientations. Therefore, they may not be understood as limit to this disclosure.

In the description of this specification, the description with reference to terms "an embodiment", "another embodiment", and the like means that specific characteristics, structures, materials, or features described in conjunction with this embodiment are included in at least one embodiment of this disclosure. In this specification, the illustrative expression of the above terms is not necessarily directed to the same embodiment or example. Additionally, the specific characteristics, structures, materials, or features described may be conjoined in any one or several embodiment(s) or example(s) in a suitable manner. Furthermore, different embodiments or examples described in this specification and characteristics in different embodiments or examples may be conjoined and combined by those skilled in the art without contradiction.

Although the embodiments of this disclosure are illustrated and described above, it can be appreciated that the embodiments described above are exemplary and cannot be understood as limiting this disclosure. Alternations, modifications, substitution, and variations may be made to the embodiments described above by those of ordinary skill in the art in the scope of this disclosure.

What is claimed is:

1. A method of producing an array substrate, comprising
providing a substrate having a drive transistor region and a switch transistor region thereon;
forming a preset layer for active layer on a side of the substrate;
patterning the preset layer for active layer to form a drive active layer and a switch active layer, wherein an orthographic projection of the drive active layer on the substrate is located in the drive transistor region, an orthographic projection of the switch active layer on the substrate is located in the switch transistor region, and a carrier concentration in the drive active layer is less than a carrier concentration in the switch active layer,
wherein said patterning the present layer for active layer comprises the steps of:
etching the present layer for active layer into a first part and a second part by a patterning process using a photoresist, wherein an orthographic projection of the first part on the substrate located in the drive transistor region, and a first photoresist layer is retained on a surface of a side of the first part away from the substrate; an orthographic projection of the second part on the substrate is located in the switch transistor region, and a second photoresist layer is retained on a surface of a side of the second part away from the substrate; and a thickness of the second photoresist layer is greater than a thickness of the first photoresist layer;
removing the first photoresist layer by etching to expose the first part, and retaining a remaining thickness of the second photoresist layer on a surface of a side of the second part away from the substrate;
setting a carrier concentration in the first part to be less than a carrier concentration in the second part by carrier concentration differentiation treatment; and
removing the remaining thickness of the second photoresist layer, so that the first part forms the drive active layer and the second part forms the switch active layer.

2. The method according to claim 1, wherein the carrier concentration differentiation treatment comprises:
performing annealing treatment on the first part or performing treatment on the first part by using plasma excited by an oxidative gas in an oxidative gas atmosphere to set a carrier concentration in the first part to be less than a carrier concentration in the second part.

3. The method according to claim 1 wherein
the step of etching the preset layer for active layer into a first part and a second part comprises:
coating a photoresist on a surface of a side of the preset layer for active layer away from the substrate;
exposing and developing the photoresist by using a halftone mask plate to form a photoresist layer, the photoresist layer comprising: the first photoresist layer with the photoresist partly retained and the second photoresist layer with the photoresist completely retained;
performing etching treatment on the preset layer for active layer to remove the preset layer for active layer which is not covered by the photoresist layer to form the first part and the second part; and the step of removing the first photoresist layer to expose the first part comprises dry etching.

4. The method according to claim 1, wherein the carrier concentration differentiation treatment comprises:
setting a thickness of the first part to be less than a thickness of the second part by etching.

5. The method according to claim 4, wherein the preset layer for active layer comprises two sublayers of which carrier concentrations are different, and the carrier concentration differentiation treatment further comprises:
removing a sublayer away from the substrate among the two sublayers in the first part by wet etching.

6. The method according to claim 1, wherein the preset layer for active layer comprises two sublayers of which carrier concentrations are different, and a surface of the drive active layer away from the substrate and a surface of the switch active layer away from the substrate belong to the two sublayers, respectively.

7. The method according to claim 6, wherein among the two sublayers, a carrier concentration in the sublayer closer to the substrate is less than a carrier concentration in the sublayer further away from the substrate.

8. The method according to claim 6, wherein in the formed preset layer for active layer, the two sublayers are adjacent to each other and are different in material.

9. The method according to claim 6, wherein the two sublayers are a first sublayer and a second sublayer, and the first sublayer is closer to the substrate than the second sublayer,
materials for forming the first sublayer comprise indium gallium zinc oxide, the first sublayer has a thickness of 10-50 nm, and a carrier concentration in the first sublayer is $10^{15}$-$10^{19}$ cm$^2$V$^{-1}$s$^{-1}$;
materials for forming the second sublayer comprise indium zinc oxide, the second sublayer has a thickness of 10-50 nm, and a carrier concentration in the second sublayer is $10^{18}$-$10^{20}$ cm$^2$V$^{-1}$s$^{-1}$.

10. An array substrate,
wherein the array substrate comprises:
a substrate; and
a drive transistor and a switch transistor located on the substrate, wherein a carrier concentration in a drive active layer of the drive transistor is less than a carrier concentration in a switch active layer of the switch transistor,
wherein the switch active layer comprises a first sublayer and a second sublayer, wherein the first sublayer is closer to the substrate than the second sublayer, and a surface of the switch active layer away from the substrate belongs to the second sublayer, and
the drive active layer comprises a third sublayer formed in the same layer with the first sublayer, and a surface of the drive active layer away from the substrate belongs to the third sublayer,
wherein materials for forming the first sublayer/third sublayer comprise indium gallium zinc oxide, the first sublayer/third sublayer has a thickness of 10-50 nm, and a carrier concentration in the first sublayer/third sublayer is $10^{15}$-$10^{19}$ cm$^2$V$^{-1}$s$^{-1}$; materials for forming the second sublayer comprise indium zinc oxide, the second sublayer has a thickness of 10-50 nm, and a carrier concentration in the second sublayer in $10^{18}$-$10^{20}$ cm$^2$V$^{-1}$s$^{-1}$.

11. The array substrate according to claim 10, wherein a thickness of the drive active layer is less than a thickness of the switch active layer; or
at least one of the drive active layer and the switch active layer comprises a plurality of sublayers provided by lamination, wherein a number of the sublayers in the drive active layer is less than a number of the sublayers in the switch active layer; or
a concentration of carriers doped in the drive active layer is less than a concentration of the carriers doped in the switch active layer.

12. A display apparatus, comprising: the array substrate according to claim 10.

* * * * *